United States Patent
Jannin et al.

(10) Patent No.: US 8,633,697 B2
(45) Date of Patent: Jan. 21, 2014

(54) METHOD FOR NMR SPECTROSCOPY WITH SUSTAINED INDUCTION DECAYS OF LONG-LIVED COHERENCES

(75) Inventors: Sami Jannin, Lausanne (CH); Aurélien Bornet, Lausanne (CH); Geoffrey Bodenhausen, Paris (FR)

(73) Assignees: Bruker BioSpin AG, Faellanden (CH); Ecole Polytechnique Fédérale de Lausanne, Lausanne (CH)

( * ) Notice: Subject to any disclaimer, the term of this patent is extended or adjusted under 35 U.S.C. 154(b) by 39 days.

(21) Appl. No.: 13/466,155

(22) Filed: May 8, 2012

(65) Prior Publication Data

US 2012/0286782 A1 Nov. 15, 2012

(30) Foreign Application Priority Data

May 10, 2011 (EP) ..................................... 11165564

(51) Int. Cl.
*G01V 3/00* (2006.01)

(52) U.S. Cl.
USPC ......................................................... 324/309

(58) Field of Classification Search
USPC ................................................. 324/300–322
See application file for complete search history.

(56) References Cited

FOREIGN PATENT DOCUMENTS

| EP | 2 270 531 | 1/2011 |
| EP | 2 270 532 | 1/2011 |

OTHER PUBLICATIONS

Bornet, A. et al., "Ultra High-Resolution NMR: Sustained Induction Decays of Long-Lived Coherences", Journal of the American Chemical Society, Aug. 8, 2011, pp. A-F.
Riddhiman Sarkar et al., "Extending the Scope of Singlet-State Spectroscopy", Chemphyschem, vol. 8, No. 18, Dec. 5, 2007, pp. 2652-2656.
Pelupessy, P. et al., "High-resolution NMR in magnetic fields with unknown spatiotemporal variations", Science 324, 1693-1697 (2009).
Pileio, G. et al. Extremely low-Frequency Spectroscopy in Low-Field Nuclear Magnetic Resonance. Phys. Rev. Lett. 103, 083002 (2009).
Sarkar, R. et al., "Long-Lived coherences for homogeneous line narrowing in spectroscopy", Phys. Rev. Lett. 104, 053001 (2010).
Sarkar, R. et al. "Long-lived coherences for line-narrowing in high-field NMR", Prog. Nucl. Magn. Reson. Spectrosc., 59 (2011) 83-90.
Bornet, A. et al. Life-times of long-lived coherences under different motional regimes, J. Magn. Reson. 206, 154-156 (2010).
Pileio, G. et al., "Theory of long-lived nuclear spin states in solution nuclear magnetic resonance. II. Singlet spin locking", J. Chem. Phys. 130, 214501 (2009).

*Primary Examiner* — Melissa Koval
*Assistant Examiner* — Daniel Miller
(74) *Attorney, Agent, or Firm* — Paul Vincent

(57) ABSTRACT

A method for nuclear magnetic resonance (NMR) spectroscopy of a sample involves excitation of long lived coherences (LLC) between the singlet state $S_0$ and the central triplet state $T_0$ of nuclei of the sample by initiating irradiation of the sample with an rf-field with carrier frequency $\omega_{rf}$; sustaining of the LLC by maintaining the rf-irradiation during an interval $\tau_2$; converting the LLC temporarily into observable magnetization by interrupting the rf-irradiation during an observation interval $\tau_3$; detecting NMR-signals during the observation interval $\tau_3$ and reconversion of the observable magnetization back into LLC after the observation interval $\tau_3$. These steps are repeated n times, wherein n is a positive integer. The method allows ultra high-resolution spectra of long-lived coherences to be obtained.

12 Claims, 13 Drawing Sheets

METHOD FOR NMR SPECTROSCOPY WITH SUSTAINED INDUCTION DECAYS OF LONG-LIVED COHERENCES

This application claims Paris convention priority of EP 11 165 564.3 filed May 10, 2011, the entire disclosure of which is hereby incorporated by reference.

BACKGROUND OF THE INVENTION

The invention concerns a method for nuclear magnetic resonance (NMR) spectroscopy of a sample comprising the following steps:
(a) excitation of long lived coherences (LLC) between the singlet state $S_0$ and the central triplet state $T_0$ of nuclei of the sample by initiating irradiation of the sample with an rf-field with a carrier frequency;
(b) sustaining of the LLC by maintaining the rf-irradiation during an interval $\tau_2$;
(c) converting the LLC temporarily into observable magnetisation by interrupting the rf-irradiation during an observation interval $\tau_3$;
(d) detecting NMR-signals during the observation interval $\tau_3$.

Most nuclear magnetic resonance (NMR) methods employ Fourier transformations of free induction decays (FID's).[1] Though widely used, this approach suffers from homogeneous decay and imperfect homogeneity of a static magnetic field, so that it is challenging to achieve line-widths below 1 Hz.[2] Sophisticated NMR pulse sequences have been developed to achieve reasonable line-widths ($1 < \Delta\nu < 50$ Hz) in moderately inhomogeneous fields, exploiting cross relaxation effects[3], observation in the earth's magnetic field[4], or a spatial correlation between the static and radio-frequency (rf) field profiles[5]. By combining refocusing and coherence transfer through couplings, one can obtain acceptable line-widths ($1 < \Delta\nu < 50$ Hz) even in very inhomogeneous fields ($\Delta\nu > 2$ kHz).[6] In systems with two scalar-coupled homonuclear spins $I = \frac{1}{2}$ and $S = \frac{1}{2}$, one can excite long-lived coherences (LLC's) that can have very long life-times $T_{LLC}$ and hence very narrow line-widths $\Delta\nu_{LLC} = 1/(\pi T_{LLC})$.[7-9] Their precession frequency is independent of offset (and hence of chemical shifts and inhomogeneous broadening) and is only determined by the sum of scalar and residual dipolar couplings ($T_{IS} = J_{IS} + 2D_{IS}$). So far, LLC's have only been observed indirectly in the manner of two-dimensional (2D) spectroscopy, i.e. point by point, either in combination with field cycling[7] or in high field.[8-9]

Principles

Long-lived coherences (LLC's) constitute a class of zero-quantum coherences that can be excited by extremely low frequency fields (ELF's) in a vanishing static field.[7] LLC's can also be excited in high fields by creating a state where the coherences $I_y$ and $-S_y$ have opposite phases, so that they can be locked by a continuous 'sustaining' rf field[8-9]. This rf field in effect suppresses the chemical shifts, thus rendering the spins magnetically equivalent, so that their eigenstates can be classified according to 'symmetrical' and 'antisymmetrical' irreducible representations of the spin permutation group. LLC's span zero-quantum transitions between states of different symmetry. Their oscillatory decays can be subjected to a Fourier transformation, yielding doublets that are reminiscent of 'J-spectroscopy'[11-13]. The life-times $T_{LLC}$ of LLC's can be a factor $\kappa$ longer than the transverse relaxation times $T_2 = T_{SQC}$ of ordinary single-quantum coherences ($T_{LLC} = \kappa T_2$), so that the line-widths $\Delta\nu_{LLC} = 1/(\pi T_{LLC})$ can be narrower by a factor $\Delta\nu_{LLC}/\Delta\nu_{SQC} = 1/\kappa$. Depending on the role of extraneous relaxation mechanisms[9], one can expect $\kappa \leq 3$ in small molecules in the extreme narrowing limit, and $\kappa \leq 9$ in the slow[14] motion limit typical of large molecules. In practice, we have observed $2.5 < \kappa < 4.3$ over a range of correlation times.[15]

Generally speaking, LLC's should not be confused with long-lived states (LLS's), also known as singlet states (SS) if there are only two spins in the system. LLS's refer to populations of antisymmetric singlet states[16-28]. LLS's have life-times that can be much longer than LLC's ($T_{LLS} \gg T_{LLC}$), but do not have any oscillatory character, and cannot give rise to J-spectra in the manner of LLC's. Both LLS's and LLC's can be temporarily converted into observable magnetisation (vide infra). This is of particular interest when the initial polarization is enhanced by 'dissolution' DNP[10,21].

If the oscillatory decays of LLC's are observed point-by-point in the manner of two-dimensional (2D) spectroscopy, they cannot be enhanced ('hyperpolarized') by 'dissolution' DNP. Recently, several 2D experiments have been successfully converted into 'ultra-fast' versions that can be combined with 'dissolution' DNP.[22-23] However, the continuous rf field, which is preferably used to sustain LLC's is not compatible with current 'ultra-fast' schemes.

It is an object of the present invention to propose a method that allows obtaining ultra high-resolution spectra of long-lived coherences with enhanced resolution.

SUMMARY OF THE INVENTION

This object is achieved by:
(e) reconverting the observable magnetisation back into LLC after the observation interval $\tau_3$; and repeating steps (b)-(e) n times, with n is a positive integer.

The irradiation of step (b) is resumed and the loop is repeated n times, where the integer n can be preferably 100 or more. It is clear for one who is skilled in the art that in the final repetition step (e) can be omitted without leaving the scope of the invention.

A long lived coherence (LLC) is a coherent superposition between the singlet and the central triplet state of two nuclei of the same kind. Long-lived coherences (LLC's) constitute a class of zero-quantum coherences. The excitation of LLC is carried out in a magnetic field, in particular in the magnetic field of the NMR magnet. Pairs of nuclei are chosen from the sample. The excitation of LLC comprises a transformation of an initial spin distribution ($I_z + S_z$) into ($I_x - S_x$) or ($I_y - S_y$) or ($2I_yS_z - 2I_zS_y$) or ($2I_xS_z - 2I_zS_x$) respectively just before the rf-field is applied, i.e. the initial spin distribution ($I_z + _z$) is flipped to the transverse plane (observable magnetisation). The excitation can be achieved by various preparations, e.g., by applying a non-selective $(\pi/2)_x$ or $(\pi/2)_y$-pulse or by applying a semi-selective $\pi$-pulse that affects only the multiplet of either spin I or spin S, followed by a non-selective $(\pi/2)_x$ or $(\pi/2)_y$-pulse, or by using an echo sequence with a band-selective refocusing pulse, or by using a long lived state filter. Other preparations are also possible. ($I_x - S_x$) or ($I_y - S_y$) or ($2I_yS_z - 2I_zS_y$) or ($2I_xS_z - 2I_zS_x$) is then transformed into LLC by initiating irradiation of the rf-field. The LLC are sustained as long as rf-irradiation is applied.

When the rf-irradiation is interrupted, the LLC is no longer sustained, but converted into observable magnetisation, whereby "observable magnetisation" means magnetisation which is detectable by MR measurements (transverse magnetisation, in particular single quantum coherences ($I_x - S_x$)). When the sustaining rf field is switched on again, the remaining observable magnetization (differences ($I_x - S_x$) or ($I_y - S_y$) or ($2I_yS_z - 2I_zS_y$) or ($2I_xS_z - 2I_zS_x$)) are reconverted into LLC's, while the sum ($I_x + S_x$) or ($I_x + S_y$) is spin-locked and decays, and the sum $2I_yS_z+2I_zS_y$ is dephased under the effect of the rf field inhomogeneity. The repetition of sustaining of the rf-field, interrupting the rf-field and detecting NMR-signals during the observation interval results in partial decay of the LLC.

The RF irradiation can consist of a composite pulse scheme comprising a manifold of pulses and phases. Nevertheless the rf-irradiation is preferably carried out along an x-axis, if the LLC contains $(I_x-S_x)$ terms and along the y-axis if the LLC contains $(I_y-S_y)$ terms, whereby the x-axis and the y-axis of the rotating reference frame are both perpendicular to the z-direction of the static field, in which the experiment is carried out.

During the irradiation intervals $\tau_2$, the coherence LLC evolves under the effect of the total coupling $2T_{IS}=2J_{IS}+4D_{IS}$ and decays with the relaxation rate $R_{LLC}=1/T_{LLC}$. During each observation interval (observation window $\tau_3$), the system evolves under the chemical shifts and again under the total coupling constant $T_{IS}$, albeit reduced by a factor 2, and decays with the single-quantum relaxation rate $R_2=1/T_2$.

The duration $\tau3$ of the observation interval can be equal for each repetition. Yet, it is also possible to choose non-constant durations for the observation interval (i.e. $\tau3$ may be different in different repetitions) to achieve sparse sampling.

This invention shows that a signal comprising a larger number n of data points can be obtained in a single scan. With the inventive method, long-lived coherences (LLC's) in homonuclear pairs of chemically inequivalent spins can be excited and sustained during protracted radio-frequency irradiation periods that alternate with brief windows for signal observation (observation interval). Fourier transformation of the sustained induction decays recorded in a single scan yields NMR spectra with line-widths in the range $10<\Delta v<100$ mHz, even in moderately inhomogeneous magnetic fields. If the windows for signal observation have a duration that is negligible compared to the protracted irradiation periods, the line-widths $\Delta v$ approach the limiting line-widths $\Delta v_{LLC}$. Even in poorly shimmed magnets where the inhomogeneous line width is $\Delta v^* > 20$ (protons) Hz, the inventive method can provide line-widths as narrow as $\Delta v_{LLC}=14$ mHz. The resulting doublets, which are reminiscent of 1-spectra, allow one to determine the sum of scalar and residual dipolar interactions in partly oriented media.

In a variant of the inventive method, the LLC are excited by transforming an initial spin polarization, $(I_z+S_z)$, in particular the thermal equilibrium Boltzmann distribution, of the spin polarization $(I_z+S_z)$ into single quantum coherences $(I_x-S_x)$ or $(I_y-S_y)$ or $(2I_yS_z-2I_zS_y)$ or $(2I_zS_x-2I_xS_z)$ prior to initiating irradiation of the sample with the rf-field.

Alternatively the sample is hyperpolarized, in particular by using dynamic nuclear polarization, thereby enhancing the spin polarization $(I_z+S_z)$ and the LLC that are subsequently excited by transforming the enhanced spin polarization $(I_z+S_z)$ into enhanced single quantum coherences $(I_x-S_x)$ or $(I_y-S_y)$ or $(2I_yS_z-2I_zS_y)$ or $(2I_zS_x-2I_xS_z)$, prior to initiating irradiation of the sample with the rf-field. Thereby the signal to noise ratio can be improved.

In a preferred variant the carrier frequency is $\omega_{rf}=(\Omega_I-\Omega_S)/2$, with $\Omega_I$ chemical shift of nuclei of the sample with spin I, and $\Omega_S$ chemical shift of nuclei of the sample with spin S.

If the carrier frequency is chosen half-way between the two chemical shifts $\sigma=-I_y-S_y$ is entirely transformed into $\sigma=I_x-S_x$ during the preparation.

The rf-field is a preferably a continuous wave-rf-field. A continuous wave rf-field constitutes the simplest way to sustain the LLC.

In a special variant the rf-field is modulated in amplitude.

Alternatively or additionally the rf-field is modulated in phase.

It is preferred that that the amplitude of the rf-field is larger than the offset in, $|\Omega_I-\Omega_S|/2$.

In a highly preferred variant a refocusing pulse is applied in the middle of the observation interval $\tau_3$. Contributions to the LLC from $(I_x+S_x)$, $(I_y+S_y)$ and $(2I_xS_z+2I_zS_x)$ and $(2I_yS_z+2I_zS_y)$, can be suppressed by using a $\pi$ pulse in the middle of each window to refocus the chemical shifts. This enables a more accurate measurement of the scalar coupling $J_{IS}$ and the total coupling $T_{IS}=J_{IS}+2D_{IS}$ even for long observation intervals $\tau3$, in particular $100\,\mu s<\tau_3<2$ ms. Long observation intervals allow one to average over a larger number of data points in each window, resulting in improved signal-to-noise ratios. The detection of NMR-signals is preferably carried out during the first half $\tau_3/2$ of the observation interval $\tau3$. But it is also possible to detected NMR-signals in the second half $\tau_3/2$ of the observation interval.

In a preferred variant the NMR spectroscopy measurement is carried out in a single experiment. A "single experiment" comprises one single preparation, i.e. only one single excitation of long lived coherences by applying rf-pulses.

Further advantages can be extracted from the description and the enclosed drawings. The features mentioned above and below can be used in accordance with the invention either individually or collectively in any combination. The embodiments mentioned are not to be understood as exhaustive enumeration but rather have exemplary character for the description of the invention.

Figure 1:
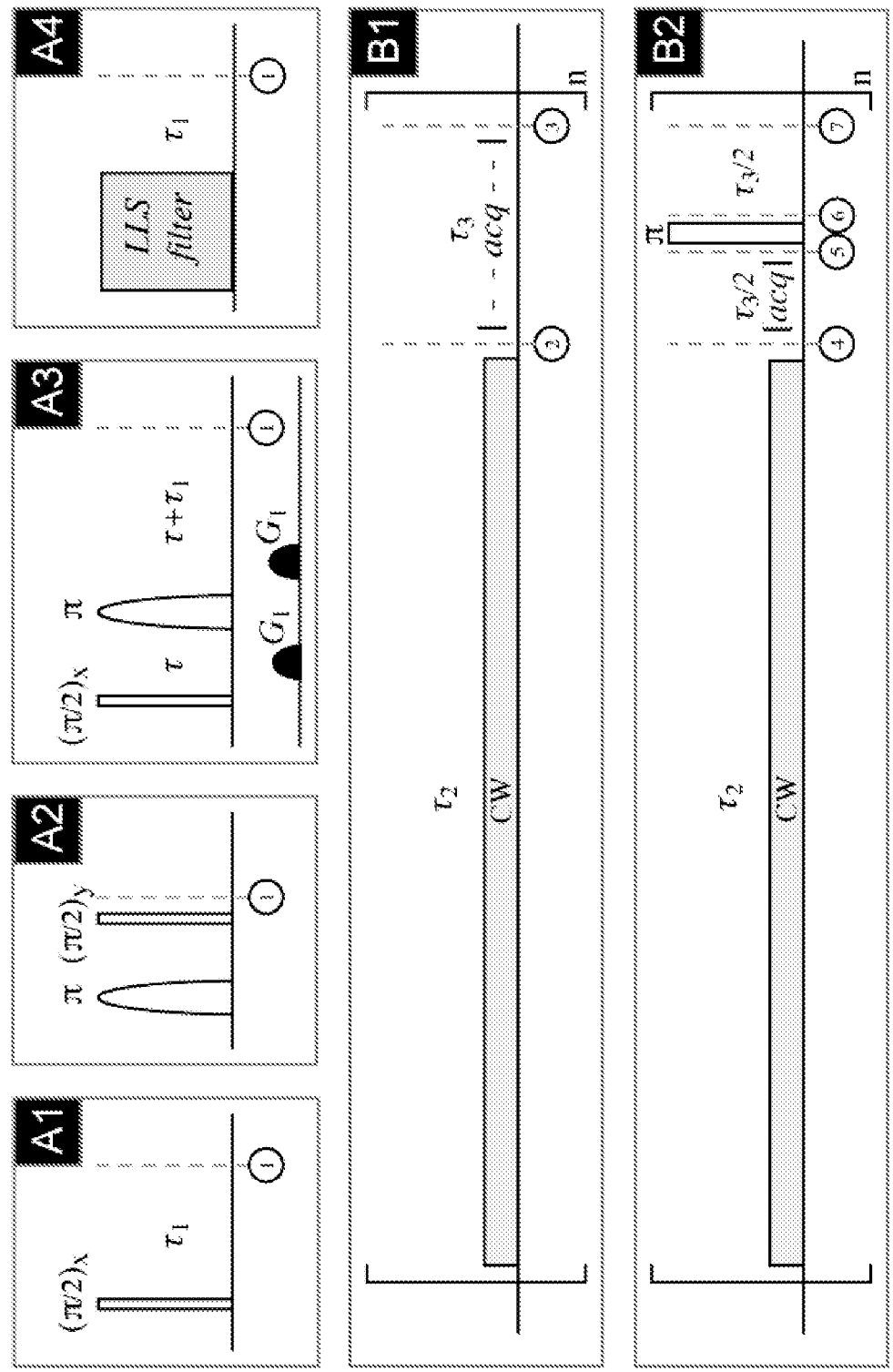
FIG. 1 shows pulse sequences for exciting and sustaining LLC's according to the invention. A complete pulse sequence comprises a preparation sequence and a sustaining/detection sequence. Each one of the four suggested preparation sequences A1-A4 allows one to create a density operator $\sigma=I_x-S_x$. Either of the two sustaining/detection sequences B1 and B2 can be used to sustain the LLC's by CW irradiation and to acquire signals in the windows $\tau_3$ or $\tau_3/2$. The sustaining-acquisition blocks are repeated n times.
Figure 2:
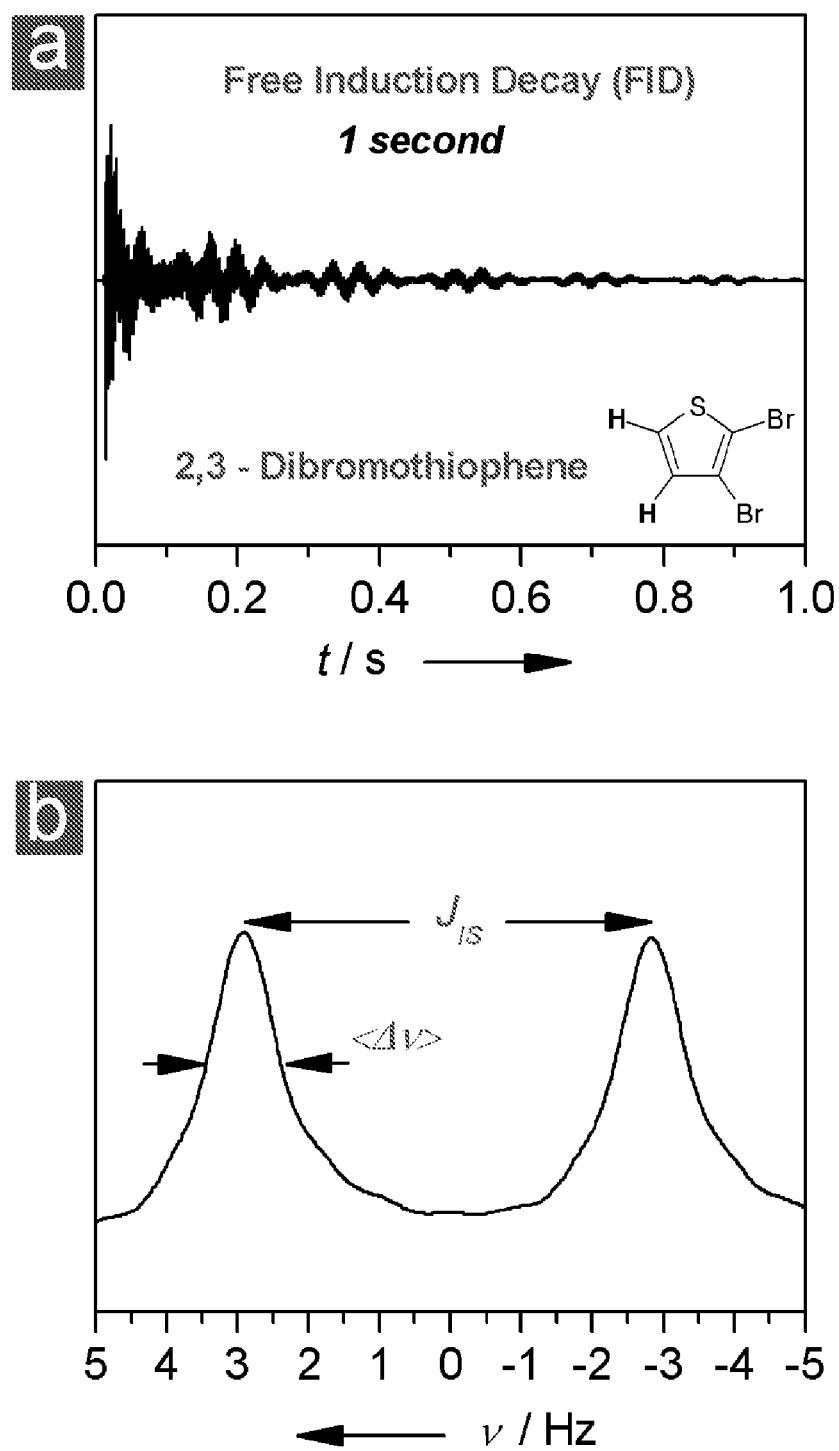
FIG. 2 shows examples of FID's and SID's recorded 'on the fly' by using the inventive method, together with their Fourier transforms.
Figure 2:
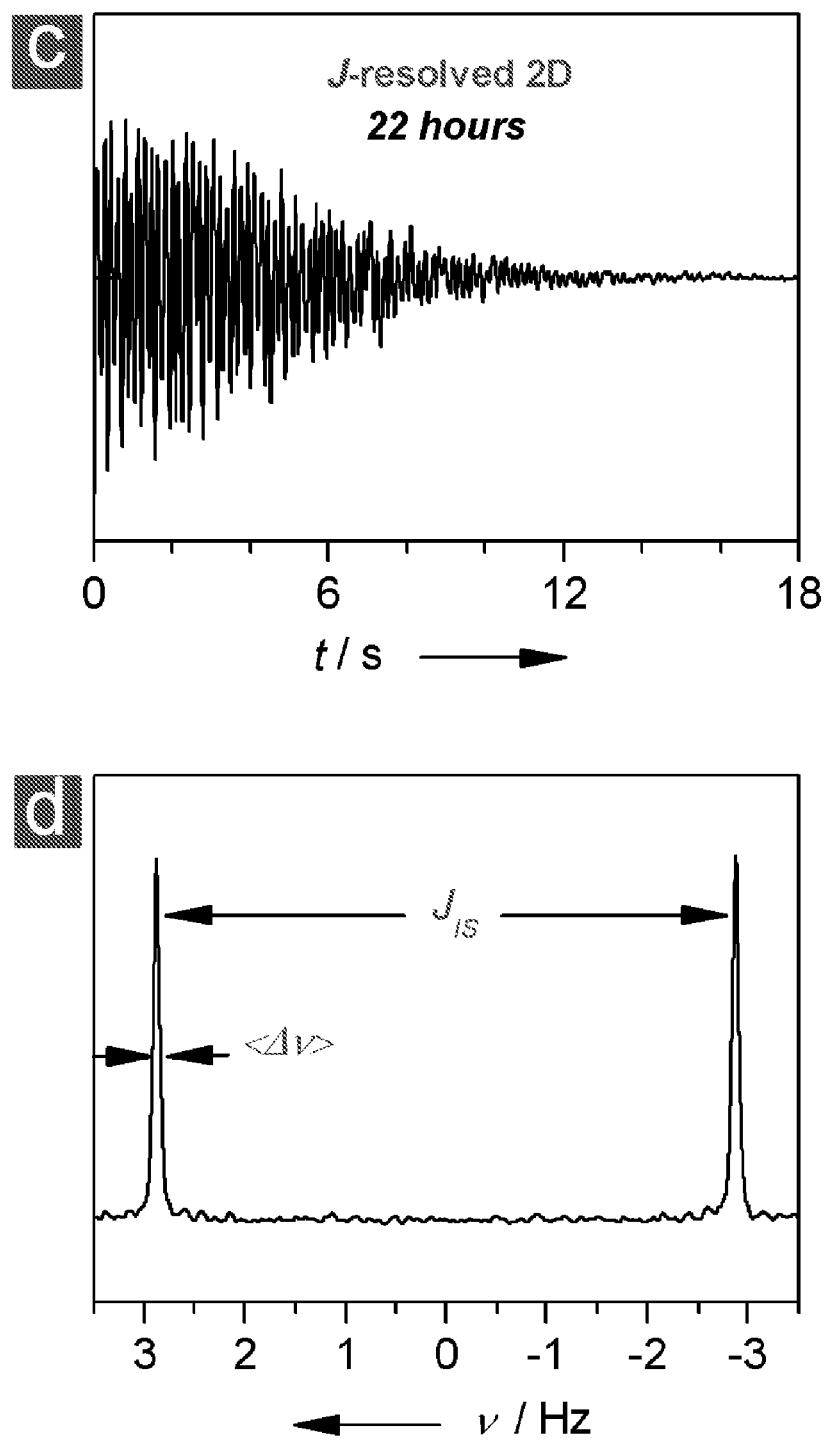
Figure 2:
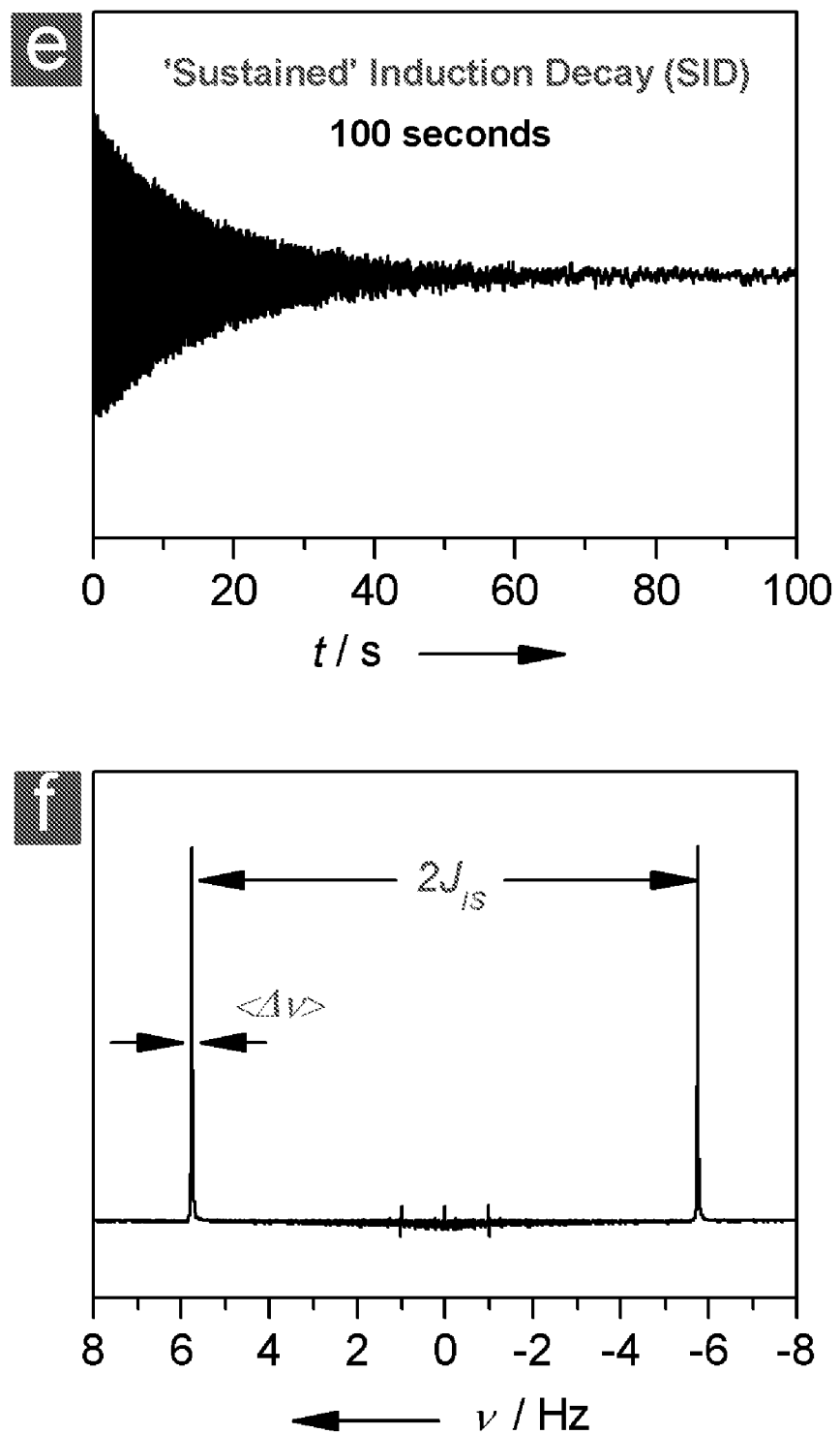
Figure 2:
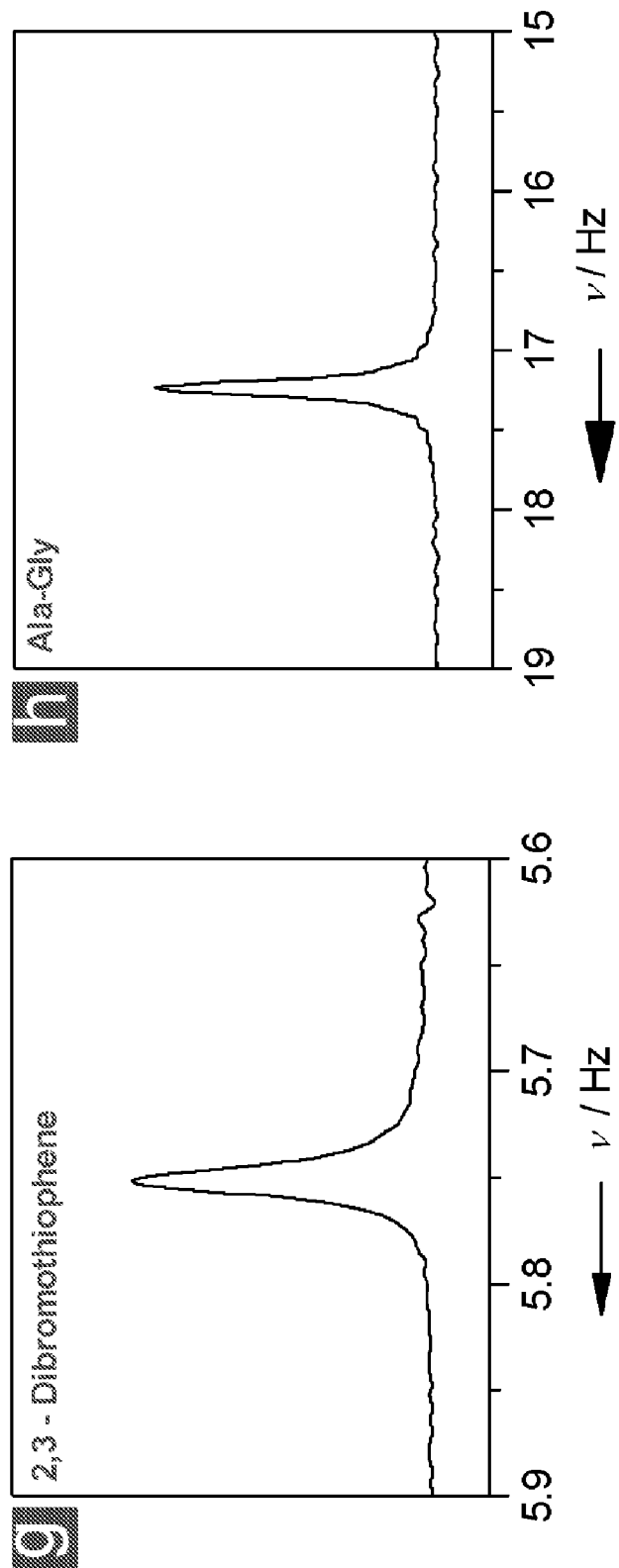
Figure 3:
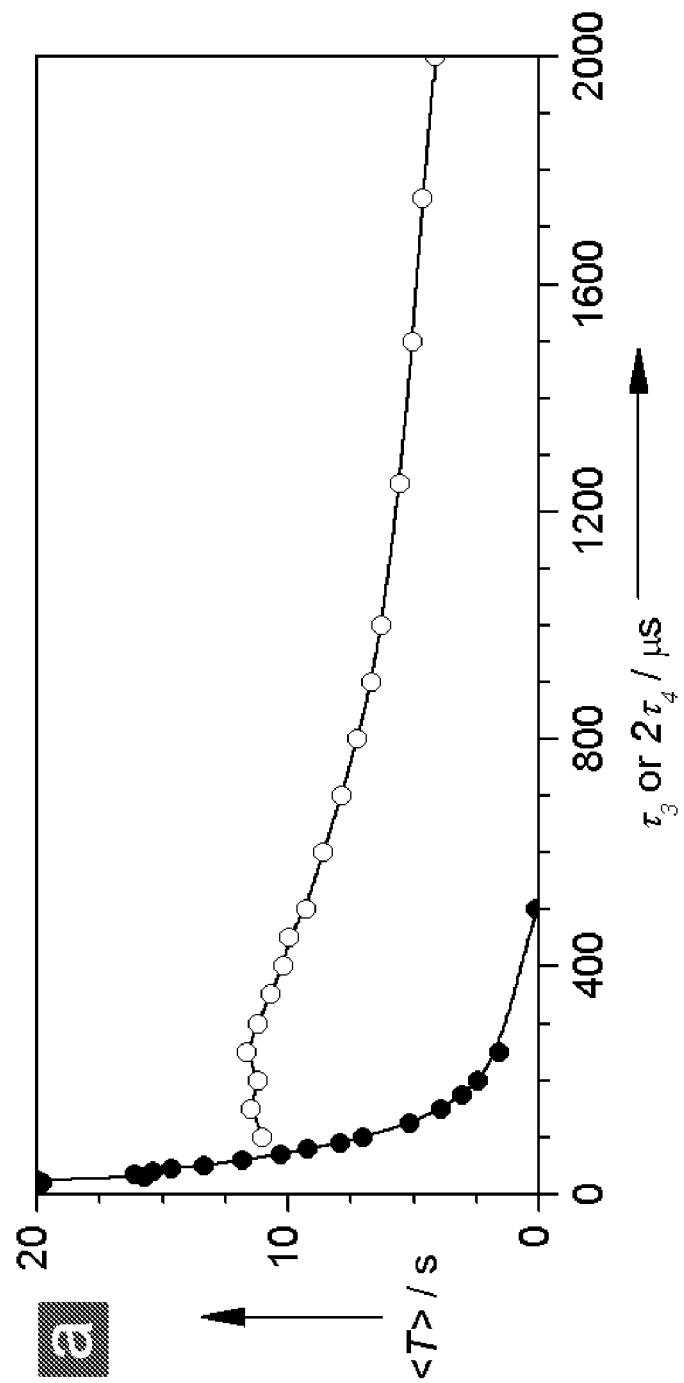
Figure 3:
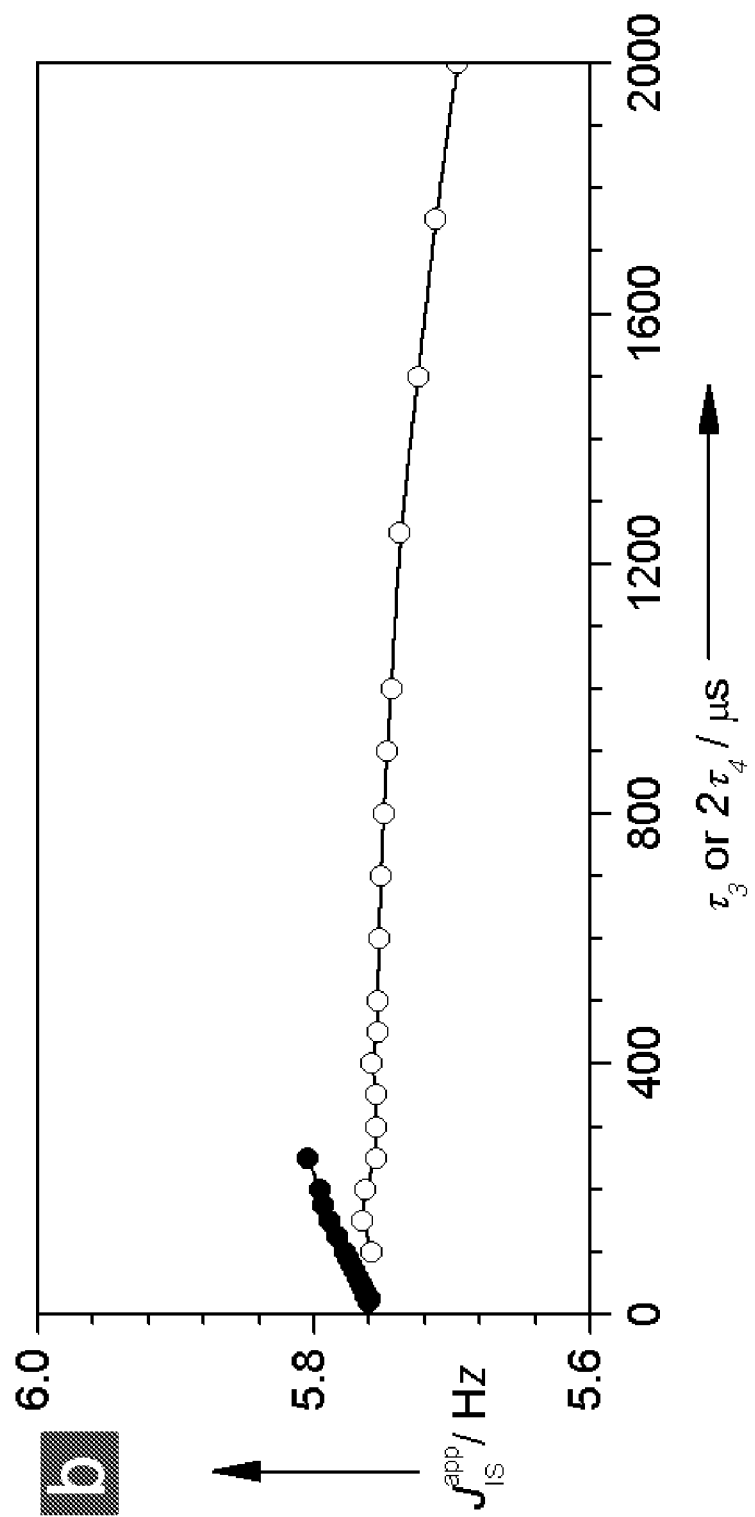
Figure 3:
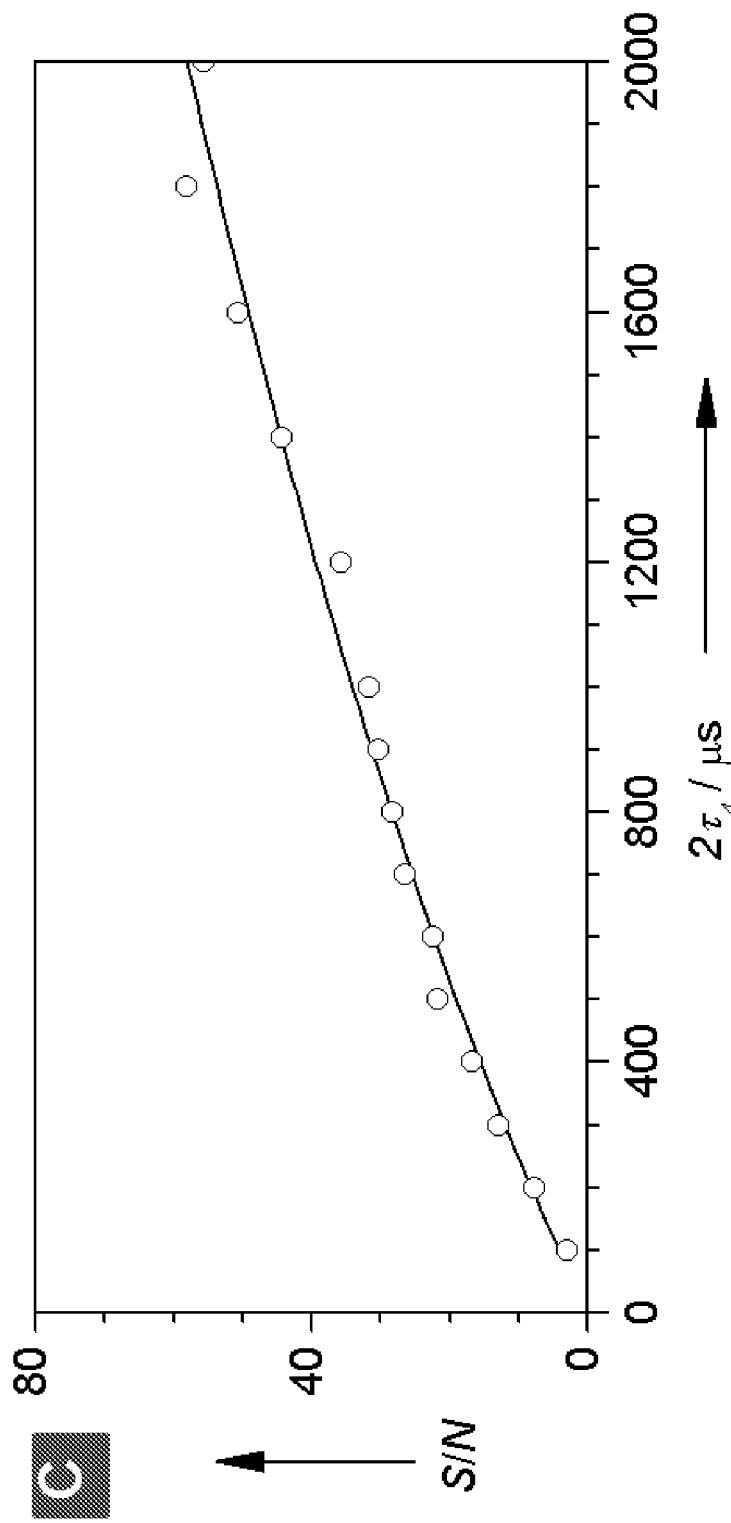
Figure 4:
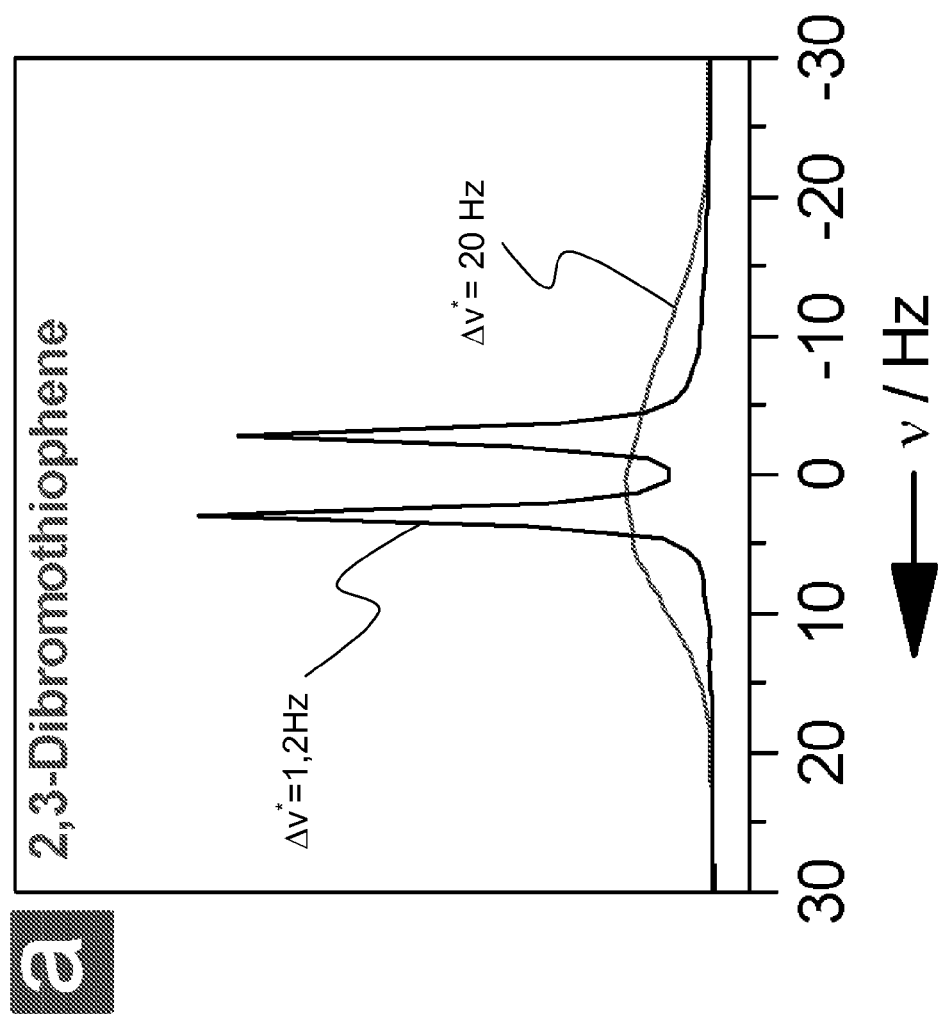
Figure 4:
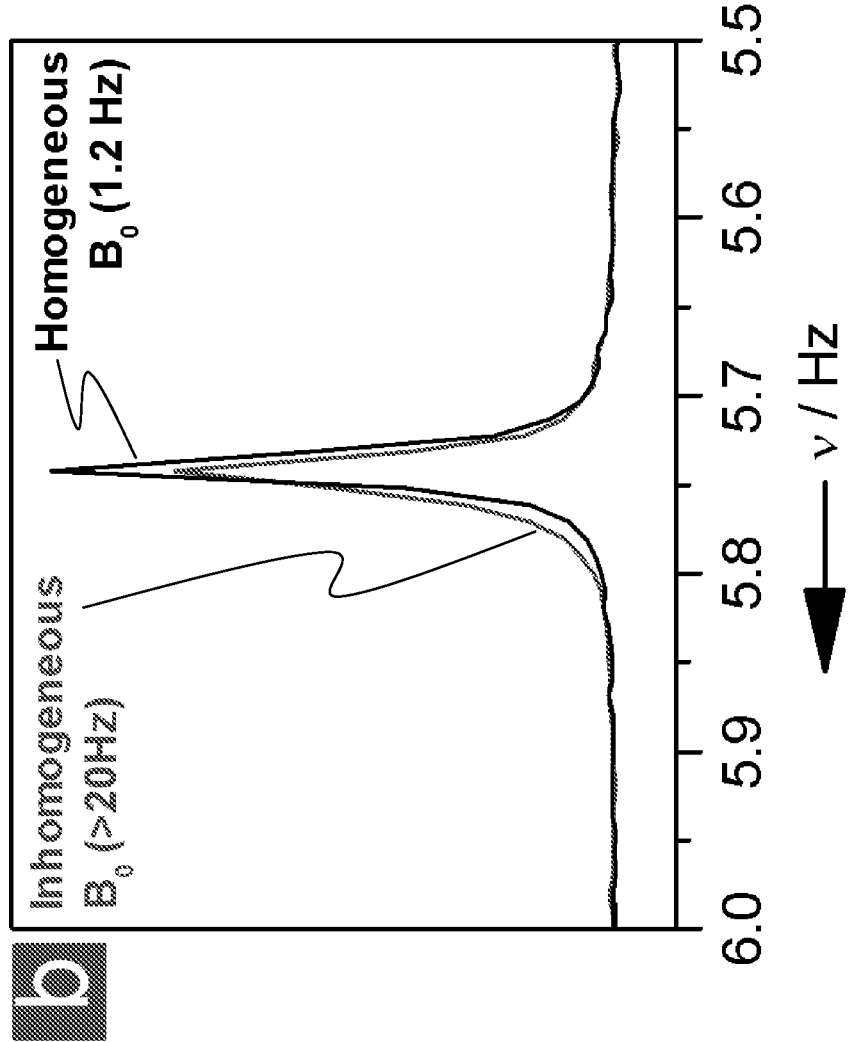
Figure 5:
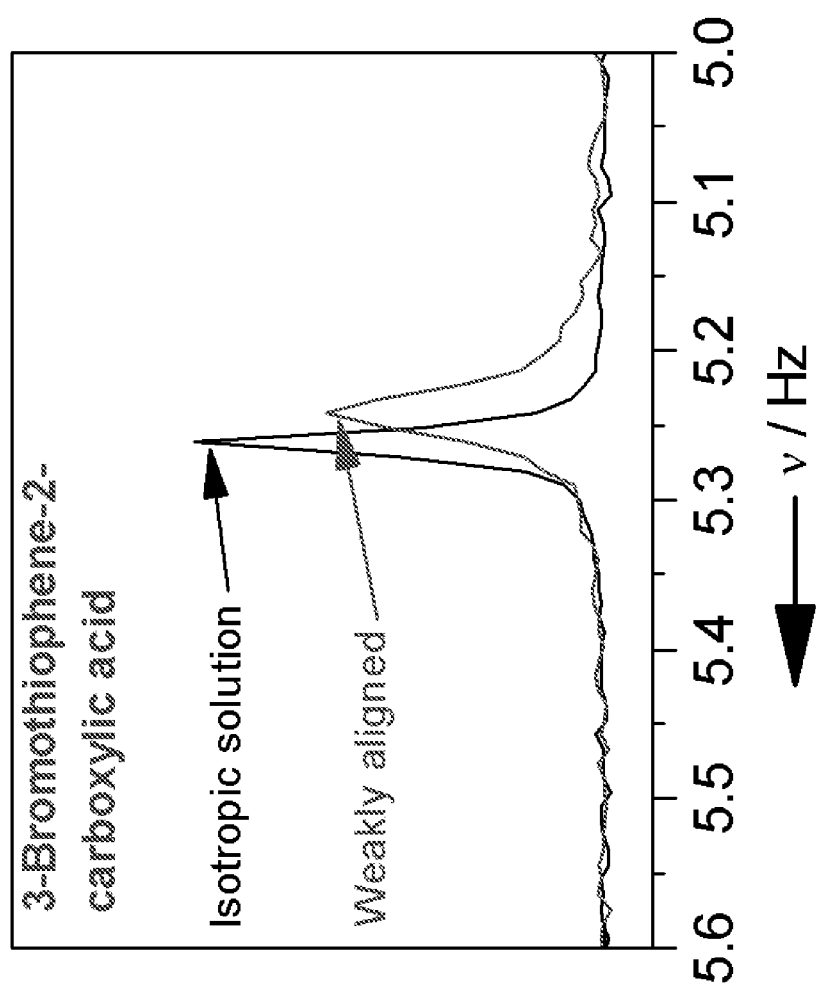
Figure 6:
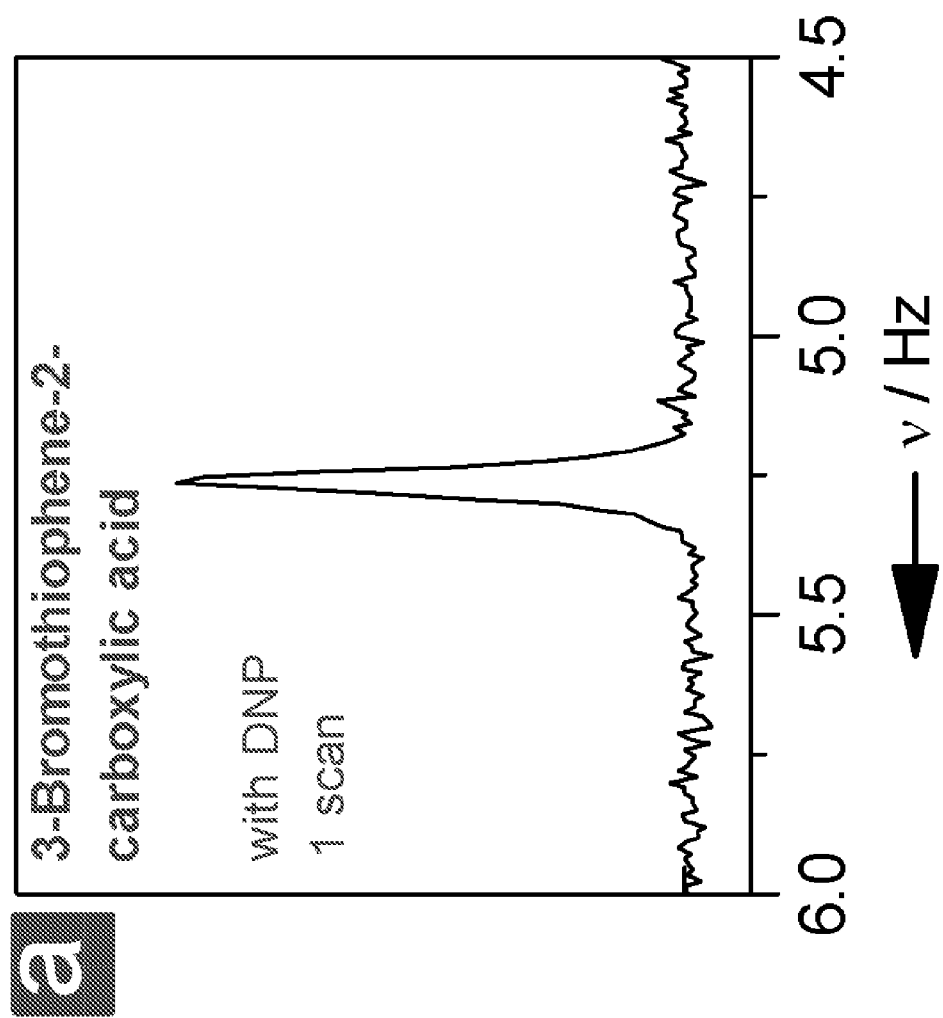
Figure 6:
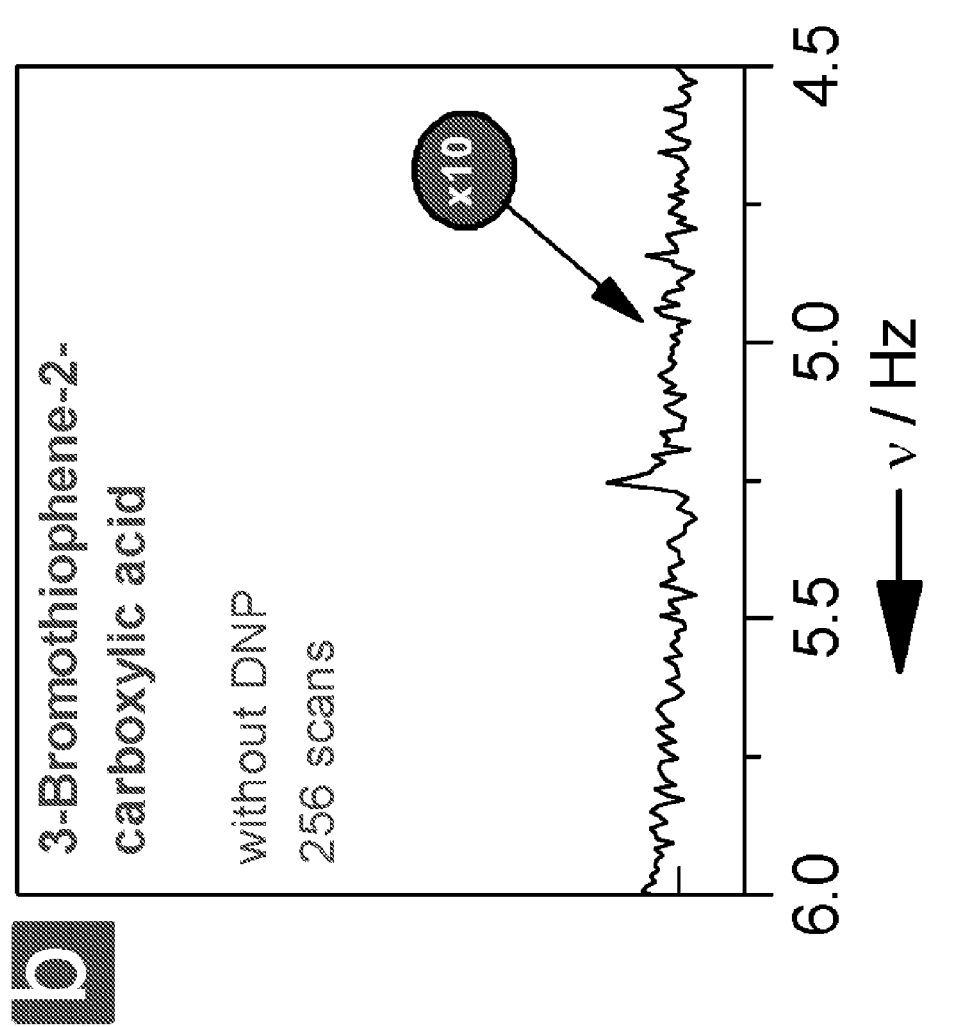

a, Real part of a conventional 'free induction decay' (FID) due to single-quantum coherences (SQC's) of the two protons of 2,3-dibromothiophene in a 20 mM isotropic solution in DMSO-$d_6$ with 30 mM ascorbic acid, measured at 11.7 T (500 MHz for protons) and 296 K;

b, Conventional Fourier transform of the FID in (a), showing a doublet with average line widths $<\Delta v> \approx 1.5$ Hz and a splitting $J_{IS} \approx 5.8$ Hz;

c, Real part of the echo amplitude of 2,3-dibromothiophene in a 20 mM isotropic solution in DMSO-$d_6$ with 30 mM ascorbic acid (note that the time scale was expanded by a factor 18 with respect to (a)) which was measured with conventional J-resolved $^1H$ spectroscopy[29];

d, Positive projection of the 2-dimensional Fourier transform, showing a doublet with line widths $<\Delta v> \approx 70$ mHz and a splitting $J_{IS} \approx 5.77$ Hz;

e, Real part of the 'sustained induction decay' (SID) of the two protons of 2,3-dibromothiophene in a 20 mM isotropic solution in DMSO-$d_6$ with 30 mM ascorbic acid acquired 'on the fly' in a single scan according to the present invention (note that the time scale was expanded by a factor 100 with respect to (a)), arising from an LLC excited in the same sample with sequence A3 of FIG. 1, sustained and observed with sequence B2, The parameters were $\tau_3/2=100$ μs, $\Delta t=\tau_2+\tau_3=50$ ms, rf amplitude of the CW sustaining field $\gamma B_1/(2\pi)=4.5$ kHz, offsets $\Omega 1/(2\pi)=-\Omega_S/(2\pi)=145$ Hz, the rf carrier being set half-way between the two chemical shifts;

f, Spectrum obtained by a real Fourier transformation of the SID of (e), showing a doublet with line widths $\langle\Delta\nu\rangle\approx 16.4$ mHz and a splitting $2J_{IS}\approx 11.5286$ Hz. If undesirable spin-locked $I_x+S_X$ terms had not been suppressed, they would give rise to peak at $\nu=0$. The narrowest line-widths $\langle\Delta\nu\rangle=14$ mHz (not shown) were observed with scheme B1, $\tau_3=30$ μs and $\Delta t=\tau_2+\tau_3=50$ ms;

g, Zoom of (d), with apparent scalar coupling constant $J_{IS}^{app}=5764.3\pm 0.2$ mHz and $\langle\Delta\nu\rangle=16.4\pm 0.1$ mHz;

h, Zoom similar to (g) of an 'on the fly' LLC spectrum of the two diastereotopic protons of glycine in L-Ala-Gly, with $J_{IS}^{app}=17236.5\pm 0.2$ mHz and $\langle\Delta\nu\rangle=115.0\pm 0.7$ mHz;

FIG. 3 shows average life-times, apparent scalar couplings, and signal-to-noise ratios.

a, Average life-times $\langle T\rangle=1/\langle R\rangle$ (see Eq. (4)) in the same sample of 2,3-dibromothiophene as in FIG. 2, measured as a function of the duration of the observation windows $\tau_3$ in scheme B1 without refocusing pulses (•) and $2\tau_4$ ($2\tau_4=\tau_3$ in case the duration of the refocusing pulse is neglected) in scheme B2 using $\pi$ refocusing pulses (○), averaging signals sampled at a rate of 500 kHz in each interval, and adapting $\tau_2$ to keep a constant dwell time $\Delta t=50$ ms. The lines are drawn to guide the eye.

b, Apparent scalar coupling constant $J_{IS}^{app}$ in 2,3-dibromothiophene observed as a function of the duration of $\tau_3$ in scheme B1 (•) or in scheme B2 (○) with a constant dwell time $\Delta t=50$ ms.

c, Signal-to-noise ratio (S/N) for the same sample of 2,3-dibromothiophene determined with scheme B2 with 100 μs$<\tau_3<$2 ms. The black line shows a fit to the function S/N$\sim\tau_3^{1/2}$;

FIG. 4 shows a comparison of NMR spectra in a homogeneous and an inhomogeneous magnetic field.

a, Conventional (single-quantum) NMR spectra of the same sample of 2,3-dibromothiophene as in FIG. 2, obtained by Fourier transformation of an FID measured at 11.7 T (500 MHz for protons), with the magnet shimmed to yield a line-width $\Delta\nu^*\sim 1.2$ Hz and deliberately de-shimmed to yield a line-width $\Delta\nu^*\sim 20$ Hz.

b, LLC spectra observed 'on the fly' of a sample of 2,3-dibromothiophene in a homogeneous ($\langle\Delta\nu_{LLC}\rangle=17.5\pm 0.2$ mHz and $J_{IS}^{app}=5.741$ Hz$\pm 0.1$ mHz) and inhomogeneous field ($\langle\Delta\nu_{LLC}\rangle=22.8\pm 0.4$ mHz and $J_{IS}^{app}=5.744$ Hz$\pm 0.2$ mHz). In a poorly shimmed magnetic field, some broadening (+5.3 mHz) and a slight error in $J_{IS}^{app}$ (+3 mHz) are thus observed. The areas of the peaks are identical. The LLC's were excited with sequence A3 and sustained and observed with sequence B2 of FIG. 1 with the following parameters: $\tau_4 4=500$ μs, $\Delta t=\tau_2+\tau_3=50$ ms, rf amplitude of CW sustaining field $\gamma B1/(2\pi)=4.5$ kHz;

FIG. 5 shows 'on the fly' LLC's according to the invention in a weakly oriented medium. The LLC spectra of 3-bromothiophene-2-carboxylic acid in a (1:1) D$_2$O/DMSO-d$_6$ with and without addition of a very small amount (0.25%) of C$_5$E$_{12}$ were observed 'on the fly' at B$_0$=11.7 T (500 MHz for protons) and T=300 K. The isotropic solution shows $J_{IS}^{app}=5252.0\pm 0.2$ mHz and $\langle\Delta\nu\rangle\approx 18.5$ mHz whereas the weakly aligned medium gives $T_{IS}^{app}=J_{IS}^{app}+2D_{IS}^{app}=5241.3\pm 0.2$ mHz and $\langle\Delta\nu\rangle\approx 40.0$ mHz, hence $2D_{IS}^{app}=-10.7\pm 0.4$ mHz. The LLC's were excited with sequence A3 and sustained and observed with sequence B2 of FIG. 1 with the following parameters: $\tau_3/2=500$ μs, $\Delta t=\tau_2+\tau_3=50$ ms, rf amplitude of CW sustaining field $\gamma B_1/(2\pi)=4.5$ kHz;

FIG. 6 shows hyperpolarized 'on the fly' LLC spectra of 3-Bromothiophene-2-carboxylic acid, showing a 300-fold enhancement of the signal intensity.

a, The sample consisted of 20 μL of a 50 mM solution of 3-bromothiophene-2-carboxylic acid in a 3:2 DMSO-d$_6$/D$_2$O (v/v) mixture, doped with 30 mM TEMPO, rapidly frozen, immersed in a field of 3.35 T, hyperpolarized by 30 mW microwave irradiation at 93.89 GHz at 1.2 K during 300 s, and dissolved with 3 mL of preheated D$_2$O to a final concentration of 250 vLIVI 3-bromothiophene-2-carboxylic acid. The hyperpolarized sample was rapidly transferred to B$_0$=11.7 T (500 MHz for protons) at T=296 K, and the LLC was then excited with uence A3, sustained and observed with sequence B2 of FIG. 1 with the following parameters: $\tau_3/2=100$ μs, $\Delta t=\tau_2+\tau_3=50$ ms, rf amplitude of CW sustaining field $\gamma B_1/(2\pi)=4.5$ kHz, offsets $\Omega_1/(2\pi)=-\Omega_S/(2\pi)=103$ Hz, the rf carrier being set half-way between the two chemical shifts.

b, Thermal equilibrium signal (i.e., without DNP) of the same sample measured with the same parameters, but with 256 scans and multiplied by a factor 10.

DESCRIPTION OF THE PREFERRED EMBODIMENT

In an experiment according to the invention, the signals are observed during brief interruptions (observation interval $\tau_3$) of a sustaining rf field (scheme B1 in FIG. 1). This leads to a temporary conversion of LLC's into observable magnetization, e.g. $I_x-S_x$. In the simplest version of the inventive method, the observation intervals $\tau_3$ are kept below 0.1 ms, so that the evolution of $I_x-S_x$ under chemical shifts, couplings and transverse relaxation can be neglected (FIG. 1 B1). In a more sophisticated variant of the inventive method, the sensitivity can be improved by increasing the duration of the observation intervals $\tau_3$ beyond 0.1 ms, and by inserting $\pi$ refocusing pulses in the centre of the observation intervals $\tau_3$ (one refocusing pulse in each observation interval $\tau_3$) to refocus chemical shifts (scheme B2 in FIG. 1).

In the example shown in FIG. 1 the initial populations, described by the density operator $\sigma=I_z+S_z$ (which may be enhanced by DNP), is transformed into $\sigma=I_x-S_x$. Scheme A1 of FIG. 1 starts with a non-selective $(\pi/2)_x$ pulse to excite the state $\sigma=-I_y-S_y$ followed by a delay $\tau_1=1/(2|\Delta\Omega_{IS}|)$, where $\Delta\Omega_{IS}=\Omega_I-\Omega_S$. Since the rf carrier frequency is normally positioned half-way between the two chemical shifts at $\omega_{rf}=(\Omega_I+\Omega_S)/2$, $\sigma=-I_y-S_y$ is transformed into $\sigma=I_x-S_x$ during the delay $\tau_1$. The precession under $J_{IS}$ in the interval $\tau_1$ can usually be neglected in weakly coupled systems where $2\pi J_{IS}<<\Delta\Omega_{IS}$.

In scheme A2, a semi-selective IC pulse applied to either spins I or S to invert the populations across either of the two doublets is immediately followed by a non-selective $(\pi/2)_y$ pulse to excite $\sigma=I_x-S_x$.[8-9] In aqueous solutions, it may be necessary to suppress the intense HDO peak.

Scheme A3 uses an echo sequence $(\pi/2)_x-\tau-(\pi)_x^{(I,S)}-\tau-$ with a band-selective refocusing pulse that acts on spins I and S but is too weak to refocus the solvent resonance. The two pulsed field gradients (PFG's) G$_1$ lead to dephasing of all magnetization components with offsets that lie outside the range of the band-selective refocusing pulse. Like in scheme A1, $\sigma=I_x-S_x$ is created after a delay, in scheme A3 the delay is $2\tau+\tau_1=2\tau+1/(2|\Delta\Omega_{IS}|)$.

Finally, scheme A4 uses a 'long-lived state filter' as explained elsewhere[15]. The latter two schemes also have the advantage of avoiding possible radiation damping induced by large HDO signals, especially when enhanced by DNP.

Both schemes B1 and B2 in FIG. 1 rely on a continuous-wave (CW) rf field for 'sustaining' or 'locking' the LLC, to suppress the chemical shifts of spins I and S, with a carrier $\omega_{rf}=(\Omega_I+\Omega_S)/2$ and an rf amplitude that is usually chosen to be larger than the offset $\omega_1>|\Omega_I-\Omega_S|/2$. More sophisticated methods may also be used to sustain LLC's over greater bandwidths as described elsewhere.[24] During rf irradiation, the eigenstates of the Hamiltonian are converted from the product base into the singlet-triplet base.[9] In the process, the density operator $\sigma=I_x-S_x$ is converted into $\sigma=(|S_0\rangle\langle T_0|+|T_0\rangle\langle S_0|)$, i.e., into a zero-quantum coherence spanning the central triplet state $T_0=N(|\alpha\beta\rangle+|\beta\alpha\rangle)$ and the singlet state $S_0=N(|\alpha\beta\rangle-|\beta\alpha\rangle)$ where $N=2^{-1/2}$. In the windows $\tau_3$ or $\tau_3/2$, where the rf field is switched off, the density operator is briefly converted back into single-quantum coherences $\sigma=I_x-S_x$, so that signals can be observed. In both schemes B1 and B2 in FIG. 1, the LLC's are sustained during the intervals $\tau_2$, while the signals are detected in the windows $\tau_3$ or $\tau_3/2$.

The sustain-observe cycles are repeated n times, resulting in 'sustained induction decays' (SID's) with a total length $t^{max}=n\Delta t$ digitised at intervals $\Delta t$. These $\Delta t$ intervals are equivalent to the 'dwell times' of ordinary free induction decays. The signals can be Fourier transformed, giving a frequency domain spectrum with a digital resolution that is determined by $1/t^{max}$ and a spectral width $1/\Delta t$ that should be larger than the total coupling $2T=2J+4D$ if one wishes to avoid aliasing.

'Windowed acquisition' has been used previously in solid-state NMR methods such as WAHUHA, MREV and their numerous variants[25-26] and for homonuclear dipolar decoupling with shaped rf pulses in the manner of DUMBO.[27] If the observation windows are too short, the signals can be perturbed by transient effects due to transmitter break-through, bearing in mind that the preamplifier must be protected during rf irradiation, and that this protection must be removed in the windows. On the other hand, if the observation windows are too long, the single-quantum coherences $\sigma=I_x-S_x$ will decay through transverse $T_2$ relaxation, dephase in the inhomogeneous static field, and evolve under the chemical shifts and scalar couplings. With an analogue-to-digital converter (ADC) running at 500 kHz, one can acquire a sample point every 2 µs, and take averages over all points recorded in each observation interval $\tau_3$ of scheme B1 or in the first and/or second $\tau_3/2$ interval of scheme B2. Reducing the number of sampling points leads to a loss in signal-to-noise ratio. In practice, the dead time between the point where the CW rf field is switched off and where the signal can be observed is typically 3 µs, so that 8 sampling points can be taken in each window if $\tau_3=20$ µs, or 498 points in each window if $\tau_3=1000$ µs. If the sustaining intervals in scheme B1 of FIG. 1 are adjusted to keep a constant dwell time $\Delta t=\tau_2+\tau_3=50$ ms so that a spectral width is $1/\Delta t=20$ Hz or $\pm 10$ Hz, windows $\tau_3=20$ µs or 1000 µs, lead to rf duty cycles of 99.96 or 98% respectively.

During the irradiation intervals $\tau_2$, the coherence $Q_{LLC}=(|S_0\rangle\langle T_0|+|T_0\rangle\langle S_0|)$ evolves under the effect of the total coupling $2T_{IS}=2J_{IS}+4D_{IS}$ and decays with the relaxation rate $R_{LLC}=R_{LLC}=1/T_{LLC}$ $$\frac{d}{dt}Q_{LLC} = -(R_{LLC}+i2\pi T_{IS})\cdot Q_{LLC} \quad (1)$$

In terms of the usual Cartesian product operators, this leads to:

$$\sigma_2[(I_x-S_x)\cos(2\pi T_{IS}\tau 2)+(2I_yS_z-2I_zS_y)\sin(2\pi T_{IS}\tau_2)]\cdot\exp(-\tau_2\cdot R_{LLC}) \quad (2)$$

This is consistent with recent work[9], but our initial papers underestimated the effect of the couplings by a factor 2. During each observation window $\tau_3$ in the scheme B1 of FIG. 1, the density operator evolves under the chemical shifts and again under the total coupling constant $T_{IS}$, albeit reduced by a factor 2, and decays with the single-quantum relaxation rate $R_2=1/T_2$. The overall effect for each sustain-and-observe cycle $\Delta t=\tau_2+\tau_3$ in scheme B1 can be written:

$$\tau_3=\cos(\Delta\Omega_{IS}/2\cdot\tau_3)[(I_x-S_x)\cos(2\pi T_{IS}\Delta t')+(2I_yS_z-2I_zS_y)\sin(2\pi T^{IS}\Delta t')]\cdot\exp(-<R>\Delta t)+\sin(\Delta\Omega_{IS}/2\cdot\tau_3)[(I_xS_x)\cos(2\pi T_{IS}\Delta t')+(2I_yS_z+2I_zS_y)\sin(2\pi T_{IS}\Delta t')]\cdot\exp(-<R>\Delta t) \quad (3)$$

Where $\Delta t'=\tau_2+\tau_3/2=\Delta t-\tau_3/2$, reflecting the scaling of the total coupling constant when the rf field is switched off. We can define and apparent total coupling constant:

$$T_{IS}^{app}=T_{IS}\Delta t'/\Delta t \quad (4)$$

Using the notation $R_2=R_{SQC}=\kappa R_{LLC}$ with $\kappa\leq 9$, the average decay rate $<R>$ in Eq. (3) is $$<R>=\frac{1}{\Delta t}(\tau_2 R_{LLC}+\tau_3 R_2)=\frac{\tau_2+\tau_3}{\tau_2+\tau_3}R_{LLC} \quad (5)$$

For $\kappa=3$, $\tau_2=49.98$ ms and $\tau_3=20$ µs, this amounts to a mere 0.08% increase in the average relaxation rate and hence to a negligible contribution to the line-width. When the CW rf field along the x-axis is switched on again, the differences $I_x-S_x$ and $2I_yS_z-2I_zS_y$ resume their identity as LLC's, while the sum $I_x+S_x$ is spin-locked and decays, and the sum $2I_yS_z+2I_zS_y$ is dephased under the effect of the rf field inhomogeneity. With a chemical shift difference $\Delta\Omega_{IS}/(2\pi)=300$ Hz, we have $\cos(\Delta\Omega_{IS}\tau_3)=0.9993\sim 1$. This infinitesimal 'leakage' of the LLC may seem negligible, but it is amplified as the sustain-observe sequence is repeated n times with $\cos(\Delta\Omega_{IS}\tau_3)^n$ so that $\cos(\Delta\Omega_{IS}\tau_3)^{100}=0.936$, thus affecting the decay of the LLC. The resulting time domain signals sampled at intervals $\Delta t$ are $$I(n\Delta t)=I_0\cos(2\pi T_{IS}n\Delta t')\cdot\exp\left[-n\Delta t\cdot\left(\frac{\tau_2}{\tau_2+\tau_3}\cdot R_{LLC}+\frac{\tau_3}{\tau_2+\tau_3}\cdot R_2\right)\right] \quad (6)$$
$$\cos(\Delta\Omega_{IS}\tau_3)^n$$
$$\ldots = I_0\cos(2\pi T_{IS}^{app}n\Delta t)\cdot\exp(-n\Delta t\cdot<R>)\cos(\Delta\Omega_{IS}\tau_3)^n$$

In order to suppress contributions from $I_x+S_x$ and $2I_yS_z+2I_zS_y$, scheme B2 uses a $\pi$ pulse in the middle of each observation window to refocus the chemical shifts. As a result, the density operator at the end of each window $\tau_3$ in scheme B2 is:

$$\sigma_7=[(I_x-S_x)\cos(2\pi T_{IS}\Delta t')+(2I_yS_z-2I_zS_y)\sin(2\pi T_{IS}\Delta t')]\cdot\exp(-<R>\Delta t) \quad (7)$$

The resulting time domain signals sampled at intervals $\Delta t$ are:

$$I(n\Delta t) = \qquad (8)$$

$$I_0 \cos(2\pi T_{IS} n\Delta t') \cdot \exp\left[-n\Delta t \cdot \left(\frac{\tau_2}{\tau_2 + 2\tau_4} \cdot R_{LLC} + \frac{\tau_3}{\tau_2 + \tau_3} \cdot R_2\right)\right]$$

$$\ldots = I_0 \cos(2\pi T_{IS}^{app} n\Delta t) \cdot \exp(-n\Delta t \cdot \langle R \rangle)$$

Experimental Evidence

FIG. 2e shows a 'sustained induction decay' (SID) that can be compared with the FID presented in FIG. 2a and with the modulated echo decay of FIG. 2c. The three signals stem from the two protons in an isotropic solution (where $T_{IS}=J_{IS}$) of 2,3-dibromothiophene (20 mM in DMSO-$d_6$ with 30 mM ascorbic acid[28] to scavenge paramagnetic oxygen), recorded with a simple $\pi/2$ pulse (FIG. 2a), observed in a J-resolved 2D manner[29] (FIG. 2c), and recorded 'on the fly' LLC's in windows $\tau_3/2=100$ is according to the invention with scheme B2 (FIG. 2e). Their Fourier transforms are presented in FIGS. 2b, 2d and 2f respectively. The LLC's 'SID' signal is described by Eq. (8) and slowly decays with a time-constant $\langle T \rangle = 1/\langle R \rangle = 19.9$ s. Its Fourier transforms (FIGS. 2f and 2g) show two lines at $\nu = \pm J_{IS}$ separated by $2J_{IS}$ with line-widths $\langle \Delta \nu \rangle = 1/(\pi \langle T \rangle) = 16.4$ mHz (resolution enhanced by a factor $\epsilon_A = \nu/\langle \Delta \nu \rangle \sim 180$ and 8.5 with respect to conventional FID and echo modulation respectively). The fact that the couplings are twice as effective in the rotating frame than in the laboratory frame is reminiscent of total correlation spectroscopy ('TOCSY')[30]. Note that the antiphase terms $2I_y S_z - 2I_z S_y$ cannot induce any signals in the orthogonal channel, so that we have a case of pure amplitude (rather than phase) modulation. The 'on the fly' LLC spectrum according to the invention of the two diastereotopic protons of glycine in L-Ala-Gly is shown in FIG. 2h.

FIG. 3a shows how the insertion of refocusing pulses in the middle of the observation windows allows one to eliminate the effects of chemical shifts. For longer windows 100 μs $<\tau_3<2$ ms, scheme B2 provides longer decays and hence narrower line-widths. Note that the narrowest lines are obtained, albeit at the expense of sensitivity, with scheme B1 with very short observation windows (typically $\tau_3=20$ μs). FIG. 3b shows how refocusing pulse allow one to obtain an accurate measurement of scalar couplings $J_{IS}$ (or total couplings $T_{IS}$ in anisotropic media) even for long observation windows $\tau_3$. (The slight decrease in $J_{IS}^{app}$ for long $\tau_3$ is described by Eq. (4)). Finally, FIG. 3c shows how longer observation windows $\tau_3$, which allow one to average over a larger number of data points in each window, result in improved signal-to-noise ratios, which are proportional to $\tau_3^{1/2}$.

In principle, the evolution of LLC's is immune to the inhomogeneity of the magnetic field if one uses the scheme B2 of FIG. 1. We should remember however that all excitation schemes A1-A4 of FIG. 1 require one to distinguish the chemical shifts of the two spins I and S, although it is not necessary to resolve their mutual coupling constant. The methods can thus tolerate a moderate inhomogeneity of the static field, as long as the line-widths fulfil the condition $\Delta \nu^* = 1/(\pi T_2)^* < \Delta \Omega_{IS}$.

FIG. 4 shows how a deliberate missetting of the shim currents ($z_1$, $z_2$, $z_3$, x, y, $z_0$x, and $z_0$y) to broaden the line-widths in the conventional (single-quantum) spectrum to about $\Delta \nu^* = 20$ Hz has little effect on the averaged line-widths $\langle \Delta \nu \rangle$ of the LLC's and the apparent scalar couplings $J_{IS}^{app}$ (+5.3 and +3 mHz, respectively). Ex-situ NMR[4-5] and MRI in moderately inhomogeneous fields (e.g., in the vicinity of discontinuities of the magnetic susceptibility) may benefit from this property.

Very weak molecular alignments, yielding minute residual dipolar couplings (RDC's) in the mHz range, can be readily determined with the inventive method. FIG. 5 shows the 'on the fly' LLC spectra according to the invention of two solutions of 3-bromothiophene-2-carboxylic acid in (1:1) $D_2O$/DMSO-$d_6$, with and without addition of a 0.25% pentaethylene glycol monododecyl ether ($C_{12}E_5$). The very weak alignement of the solute gives rise to a net RDC with $2\text{-}D_{IS}^{app} = -10.7 \pm 0.4$ mHz. The order parameter of the $r_{HH}$ vector that connects the two protons in 3-bromothiophene-2-carboxylic acid can be estimated to be as small as $S \leq (2.52 \pm 0.10) \cdot 10^{-6}$ (assuming that the internuclear distance is $r_{HH} = 2.662$ Å like in thiophene[31], and assuming that the average $r_{HH}$ vector is oriented along $B_0$, i.e., $\theta = 0$).

Since LLC spectra can be recorded in a single scan, they can be boosted by 'dissolution' DNP. Spectra of a 20 μL solution of 50 mM 2,3-dibromothiophene dissolved in a 3:2 DMSO-$d_6$/$D_2O$ (v/v) mixture doped with 30 mM TEMPOL are compared in FIG. 6 with and without hyperpolarization by 'dissolution' DNP (see Methods section below). The dissolution, transfer and injection required 3.2 s. After an additional 3 s of settling time in the NMR tube, some bubbles and convection currents cannot be ruled out. These tend to broaden ordinary (single-quantum) line-widths, but have little effect on LLC spectra. The LLC's were excited, sustained, and observed with sequences A3 and B2 of FIG. 1. The enhancement was $\epsilon_{DNP} \approx 300$. It may be possible to improve this performance by preventing losses of the proton polarization due to relaxation in low fields during the voyage between the DNP polariser and the NMR magnet.[32]

Methods

Sample Preparation

DNP Sample:

a 20 μL solution of 50 mM 3-bromothiophene-2-carboxylic acid (97%, Aldrich) dissolved in a 3:2 mixture of DMSO-$d_6$/$D_2O$ (v/v) (99.98%, Aldrich) doped with 30 mM 4-Hydroxy-2,2,6,6-tetramethylpiperidine 1-oxyl (TEMPOL) (purum, ≥97.0%, Fluka). The freshly prepared mixture was rapidly frozen in liquid nitrogen to form 104 beads.

Ascorbate Scavenger:

a 3 M $D_2O$ solution of sodium L-ascorbate (≥99%, Aldrich) was prepared and rapidly frozen in liquid nitrogen (104 beads).

NMR Samples:

a 20 mM isotropic solution of 2,3-dibromothiophene (98% Aldrich) in DMSO-$d_6$ with addition of 30 mM L-ascorbic acid (BioXtra, ≥99.0%, Sigma) for scavenging paramagnetic oxygen was prepared and sealed in a 5 mm NMR tube.

Aligned Media:

Two 50 mM solution of 3-bromothiophene-2-carboxylic acid in a (1:1) $D_2O$/DMSO-$d_6$ mixture with addition of 30 mM L-ascorbic acid for scavenging paramagnetic oxygen were prepared, one with and the other without addition of 0.25% of pentaethylene glycol monododecyl ether ($C_{12}E_5$, Sigma≥98%) for partial alignment, and sealed in 5 mm NMR tubes.

Peptide Sample:

A 0.5 M solution of L-ala-gly (Sigma) in $D_2O$ with addition of 30 mM sodium L-ascorbate (≥99%, Aldrich) was prepared and sealed in a 5 mm NMR tube. All chemicals were used without further purification.

Hyperpolarization

DNP was performed by thermal mixing at 1.2 K and 3.35 T in a home-built 'dissolution' DNP polarizer[33-35] by applying a CW microwave irradiation at $f_{\mu w}$=93.89 GHz and $P_{\mu w}$=30 mW for 5 minutes. The DNP build-up of $^1$H magnetization is fast ($\tau_{DNP}$~120 s) and yields high proton spin polarization P($^1$H)~20-40% depending on sample composition.[36] About 20 µL of frozen beads of the polarized sample, together with 90 µL of frozen beads of a 3 M $D_2O$ solution of sodium ascorbate, were rapidly dissolved with 3 mL of preheated $D_2O$ (T=440 K and P=1.2 MPa) and intimately mixed within 700 ms, transferred in 1.5 s to a 11.7 T NMR magnet through a 1 mm inner diameter PTFE tube pressurized with helium gas at 0.6 MPa, and allowed to settle for 0.5 s, prior to injection into a pre-locked NMR tube, which required another 0.5 s. After a further 3 s settling time in the NMR tube to allow turbulences to slow down, the LLC was excited, sustained, and observed with the sequences A3 and B2 of FIG. 1.

NMR Measurements

NMR measurements were performed on a 500 MHz spectrometer equipped with an Inverse 5 mm Bruker Cryo-Probe™. The 'on the fly' LLC pulse program and excitation/acquisition sequences were designed and performed with TopSpin 2.1.

In conclusion, the present invention describes an 'on-the-fly' method where the radio-frequency (rf) irradiation required to sustain the LLC's in high magnetic field is briefly interrupted, normally at regular intervals, so that the LLC's are temporarily converted into single-quantum coherences (SQC's) that can be observed. The method according to the invention allows one to obtain ultra high-resolution spectra of long-lived coherences (LLC's) 'on the fly' in one-dimensional fashion by time-shared 'windowed acquisition'. This allows one to determine very accurate total couplings T=J+ 2D. The method can be applied to either isotropic or anisotropic phases, providing ultra-high resolution even in moderately inhomogeneous magnetic fields. The signals can be enhanced by "dissolution" DNP[10]. The technique has been applied to pairs of spins in this study, but it is intended to extend the scope of application of 'on the fly' LLC's in the near future to multiple spin systems (N>2) with broad-band excitation and detection (replacing CW by composite pulses) of several LLC's in the same molecule or in mixtures. Since inhomogeneous fields are not detrimental to LLC's, ex-situ or in-cell studies should be readily feasible with unprecedented linewidths, and since the long lifetimes of LLC's are exquisitely sensitive to the presence of paramagnetic species[28], we believe they should be sensitive probes for the detection paramagnetic species such as oxygen.

REFERENCES

1. Ernst, R. R. & Anderson, W. A. Application of Fourier transform spectroscopy to magnetic resonance. *Rev. Sci. Instrum.* 37, 93 (1966).
2. Allerhand, A., Addleman, R. E. & Osman, D. Ultrahigh resolution NMR. 1. General considerations and preliminary results for C-13 NMR. *J. Am. Chem. Soc.* 107, 5809-5810 (1985).
3. Balbach, J. J., Conradi, M. S., Cistola, D. P., Tang, C. G., Garbow, J. R. & Hutton, W. C. High-resolution NMR in inhomogeneous fields. *Chem. Phys. Lett.* 277, 367-374 (1997).
4. Appelt, S., Kuhn, H., Hasing, F. W. & Blumich, B. Chemical analysis by ultrahigh-resolution nuclear magnetic resonance in the earth's magnetic field. *Nat. Phys.* 2, 105-109 (2006).
5. Meriles, C. A., Sakellariou, D., Heise, H., Moule, A. J. & Pines, A. Approach to high-resolution ex situ NMR spectroscopy. *Science* 293, 82-85 (2001).
6. Pelupessy, P., Rennella, E. & Bodenhausen, G. High-resolution NMR in magnetic fields with unknown spatiotemporal variations. *Science* 324, 1693-1697 (2009).
7. Pileio, G., Carravetta, M. & Levitt, M. H. Extremely Low-Frequency Spectroscopy in Low-Field Nuclear Magnetic Resonance. *Phys. Rev. Lett.* 103, 083002 (2009).
8. Sarkar, R., Ahuja, P., Vasos, P. R. & Bodenhausen, G. Long-lived coherences for homogeneous line narrowing in spectroscopy. *Phys. Rev. Lett.* 104, 053001 (2010).
9. Sarkar, R., Ahujab, P., Vasos, P. R., Bornet, A., Wagnieres, O. & Bodenhausen, G. Long-lived coherences for line-narrowing in high-field NMR. *Prog. Nucl. Magn. Reson. Spectrosc., in press* (2011).
10. Ardenkjaer-Larsen, J. H., Fridlund, B., Gram, A., Hansson, G., Hansson, L., Lerche, M. H., Servin, R., Thaning, M. & Golman, K. Increase in signal-to-noise ratio of >10,000 times in liquid-state NMR. *Proc. Natl. Acad. Sci. U.S.A.* 100, 10158-10163 (2003).
11. Freeman, R. & Hill, H. D. W. *Dynamic nuclear magnetic resonance spectroscopy*, (Academic Press, New York, 1975).
12. Bodenhausen, G., Freeman, R. & Turner, D. L. Two-dimensional J spectroscopy: proton-coupled carbon-13 NMR. *J. Chem. Phys.* 65, 839-840 (1976).
13. Bodenhausen, G., Freeman, R., Morris, G. A. & Turner, D. L. Proton-coupled carbon-13 J spectra in the presence of strong coupling. II. *J. Magn. Reson.* 28, 17-28 (1977).
14. Pelupessy, P., Duma, L. & Bodenhausen, G. Improving resolution in single-scan 2D spectroscopy. *J. Magn. Reson.* 194, 169-174 (2008).
15. Bornet, A., Sarkar, R. & Bodenhausen, G. Life-times of long-lived coherences under different motional regimes. *J. Magn. Reson.* 206, 154-156 (2010).
16. Carravetta, M., Johannessen, O. G. & Levitt, M. H. Beyond the T-1 limit: Singlet nuclear spin states in low magnetic fields. *Phys. Rev. Lett.* 92, 153003-153007 (2004).
17. Carravetta, M. & Levitt, M. H. Theory of long-lived nuclear spin states in solution nuclear magnetic resonance. I. Singlet states in low magnetic field. *J. Chem. Phys.* 122, 214505 (2005).
18. Sarkar, R., Vasos, P. R. & Bodenhausen, G. Singlet-state exchange NMR spectroscopy for the study of very slow dynamic processes. *J. Am. Chem. Soc.* 129, 328-334 (2007).
19. Pileio, G. & Levitt, M. H. Theory of long-lived nuclear spin states in solution nuclear magnetic resonance. II. Singlet spin locking. *J. Chem. Phys.* 130, 214501 (2009).
20. Ahuja, P., Sarkar, R., Vasos, P. R. & Bodenhausen, G. Long-lived States in Multiple-Spin Systems. *Chem. Phys. Chem.* 10, 2217-2220 (2009).
21. Vasos, P. R., Comment, A., Sarkar, R., Ahuja, P., Jannin, S., Ansermet, J. P., Konter, J. A., Hautle, P., van den Brandt, B. & Bodenhausen, G. Long-lived states to sustain hyperpolarized magnetization. *Proc. Natl. Acad. Sci. U.S.A.* 106, 18475-18479 (2009).
22. Frydman, L. & Blazina, D. Ultrafast two-dimensional nuclear magnetic resonance spectroscopy of hyperpolarized solutions. *Nat. Phys.* 3, 415-419 (2007).
23. Pelupessy, P. Adiabatic single scan two-dimensional NMR spectrocopy. *J. Am. Chem. Soc.* 125, 12345-12350 (2003).
24. Sarkar, R., Ahuia, P., Moskau, D., Vasos, P. R. & Bodenhausen, G. Extending the scope of singlet-state spectroscopy. *Chem. Phys. Chem.* 8, 2652-2656 (2007).

25. Waugh, J. S., Huber, L. M. & Haeberlen, U. Approach to high-resolution NMR in solids. *Phys. Rev. Lett.* 20, 180 (1968).
26. Rhim, W. K., Elleman, D. D. & Vaughan, R. W. Enhanced resolution for solid state NMR. *J. Chem. Phys.* 58, 1772-1773 (1973).
27. Lesage, A., Sakellariou, D., Hediger, S., Elena, B., Charmont, P., Steuernagel, S. & Emsley, L. Experimental aspects of proton NMR spectroscopy in solids using phase-modulated homonuclear dipolar decoupling. *J. Magn. Reson.* 163, 105-113 (2003).
28. Miéville, P., Ahuja, P., Sarkar, R., Jannin, S., Vasos, P. R., Gerber-Lemaire, S., Mishkovsky, M., Comment, A., Gruetter, R., Ouari, O., Tordo, P. & Bodenhausen, G. Scavenging free radicals to preserve enhancement and extend relaxation times in NMR using dynamic nuclear polarization. *Angew. Chem. Intern. Ed.* 49, 6182-6185 (2010).
29. Aue, W. P., Karhan, J. & Ernst, R. R. Homonuclear broadband decoupling and 2-dimensional J-resolved NMR-spectroscopy. *J. Chem. Phys.* 64, 4226-4227 (1976).
30. Braunschweiler, L. & Ernst, R. R. Coherence transfer by isotropic mixing—application to proton correlation spectroscopy. *J. Magn. Reson.* 53, 521-528 (1983).
31. Bak, B., Christensen, D., Hansen-Nygaard, L. & Rastrup-Andersen, J. The structure of thiophene. *J. Mol. Spectrosc.* 7, 58-63 (1961).
32. Miéville, P., Jannin, S. & Bodenhausen, G. Relaxometry of insensitive nuclei: optimizing dissolution dynamic nuclear polarization. *J. Magn. Reson.*, in press (2011).
33. Comment, A., van den Brandt, B., Uffmann, K., Kurdzesau, F., Jannin, S., Konter, J. A., Hautle, P., Wenckebach, W. T. H., Gruetter, R. & van der Klink, J. J. Design and performance of a DNP prepolarizer coupled to a rodent MRI scanner. *Concepts Magn. Reson. B* 31B, 255-269 (2007).
34. Comment, A., van den Brandt, B., Uffmann, K., Kurdzesau, F., Jannin, S., Konter, J. A., Hautle, P., Wenckebach, W. T., Gruetter, R. & van der Klink, J. J. Principles of operation of a DNP prepolarizer coupled to a rodent MRI scanner. *Appl. Magn. Reson.* 34, 313-319 (2008).
35. Jannin, S., Comment, A., Kurdzesau, F., Konter, J. A., Hautle, P., van den Brandt, B. & van der Klink, J. J. A 140 GHz prepolarizer for dissolution dynamic nuclear polarization. *J. Chem. Phys.* 128, 241102 (2008).
36. Kurdzesau, F., van den Brandt, B., Comment, A., Hautle, P., Jannin, S., van der Klink, J. J. & Konter, J. A. Dynamic nuclear polarization of small labelled molecules in frozen water-alcohol solutions. *J. Phys. D: Appl. Phys.* 41, 155506 (2008).

We claim:
1. A method for nuclear magnetic resonance (NMR) spectroscopy of a sample, the method comprising the steps of:
   a) exciting long lived coherences (LLC) between a singlet state $S_0$ and a central triplet state $T_0$ of nuclei of the sample by irradiating the sample with an rf-field having a carrier frequency $\omega_{rf}$;
   b) sustaining the LLC by maintaining rf-irradiation during an interval $\tau_2$;
   c) temporarily converting the LLC into observable magnetisation by interrupting the rf-irradiation during an observation interval $\tau_3$;
   d) detecting NMR-signals during the observation interval $\tau_3$;
   e) reconverting the observable magnetisation back into LLC after the observation interval $\tau_3$; and
   f) repeating steps (b) to (e) n times, wherein n is a positive integer.
2. The method of claim 1, comprising exciting the LLC by transforming an initial spin polarization, $(I_z+S_z)$ into single quantum coherences $(I_x-S_x)$ or $(I_y-S_y)$ or $(2I_yS_x-2I_xS_y)$ or $(2I_xS_z-2IS_x)$ prior to initiating irradiation of the sample with the rf-field.
3. The method of claim 2, wherein the initial spin polarization is a thermal equilibrium Boltzmann distribution.
4. The method of claim 1, comprising hyperpolarizing the sample to enhance a spin polarization $(I_z+S_z)$, thereby enhancing LLC that are subsequently excited by transforming the enhanced spin polarization $(I_z+S_z)$ into enhanced single quantum coherences $(I_x-S_x)$ or $(I_y-S_y)$ or $(2I_yS_z-2I_zS_y)$ or $(2I_xS_z-2I_zS_x)$ prior to initiating irradiation of the sample with the rf-field.
5. The method of claim 4, comprising hyperpolarizing the sample using dynamic nuclear polarization.
6. The method of claim 1, wherein the carrier frequency is $\omega_{rf}=(\Omega_I-\Omega_S)/2$, wherein $\Omega_I$ is a chemical shift of nuclei of the sample with spin I, and wherein $\Omega_S$ is a chemical shift of nuclei of the sample with spin S.
7. The method of claim 1, wherein the rf-field is a continuous-wave rf-field.
8. The method of claim 1, wherein the rf-field is modulated in amplitude.
9. The method of claim 1, wherein the rf-field is modulated in phase.
10. The method of claim 6, wherein an amplitude of the rf-field is larger than an offset $|\Omega_I-\Omega_S|/2$.
11. The method of claim 1, comprising applying a refocusing pulse in a middle of the observation interval $\tau_3$.
12. The method of claim 1, comprising carrying out an NMR spectroscopy measurement in a single experiment.

* * * * *